(12) United States Patent
Huang et al.

(10) Patent No.: US 7,250,660 B1
(45) Date of Patent: Jul. 31, 2007

(54) ESD PROTECTION THAT SUPPORTS LVDS AND OCT

(75) Inventors: Cheng-Hsiung Huang, Cupertino, CA (US); Chih-Ching Shih, Pleasanton, CA (US); Jeffrey Tyhach, Sunnyvale, CA (US); Guu Lin, San Jose, CA (US); Chiakang Sung, Milpitas, CA (US); Stephanie T. Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 383 days.

(21) Appl. No.: 10/891,988

(22) Filed: Jul. 14, 2004

(51) Int. Cl.
*H01L 23/62* (2006.01)
*H01L 29/72* (2006.01)
*H01L 29/73* (2006.01)
*H01L 29/74* (2006.01)
*H01L 31/111* (2006.01)

(52) U.S. Cl. ............ 257/355; 257/173; 257/174; 257/356; 257/357; 257/358; 257/359; 257/360; 257/361; 257/362; 257/363

(58) Field of Classification Search ........ 257/173–174, 257/355, 356–363
See application file for complete search history.

(56) References Cited

U.S. PATENT DOCUMENTS

| | | | | | |
|---|---|---|---|---|---|
| 5,150,187 | A | * | 9/1992 | Huang | 257/359 |
| 5,367,187 | A | * | 11/1994 | Yuen | 257/401 |
| 5,828,119 | A | * | 10/1998 | Katsube | 257/491 |
| 6,593,799 | B2 | * | 7/2003 | De et al. | 327/534 |
| 7,005,939 | B2 | * | 2/2006 | Zerbe et al. | 333/100 |
| 2001/0003368 | A1 | * | 6/2001 | Shim et al. | 257/391 |
| 2002/0159208 | A1 | * | 10/2002 | Ker et al. | 361/56 |
| 2003/0058027 | A1 | * | 3/2003 | Kwon et al. | 327/401 |
| 2004/0070900 | A1 | * | 4/2004 | Ker et al. | 361/56 |
| 2004/0219760 | A1 | * | 11/2004 | Chaine et al. | 438/400 |
| 2006/0202711 | A1 | * | 9/2006 | Kubo | 326/30 |

* cited by examiner

*Primary Examiner*—Ida M. Soward
(74) *Attorney, Agent, or Firm*—Morgan, Lewis & Bockius LLP (57) ABSTRACT

Circuits are described that provide electrostatic discharge protection for I/O circuits that support the low voltage differential signaling (LVDS) and on-chip termination (OCT) standards. At least one additional transistor is connected across an I/O transistor. In the case of LVDS, a pair of stacked transistors is used in which the distance between the source/drain region and a well tap is considerably greater for the transistor connected to the I/O pad. A PMOS transistor and an NMOS transistor may also be connected in series between a first node such as a power supply node and the I/O pad. An OCT circuit is also disclosed in which the spacing between the source/drain region and a well tap in the OCT transistor is smaller than that in the I/O transistor.

20 Claims, 9 Drawing Sheets

ESD PROTECTION THAT SUPPORTS LVDS AND OCT

The present invention relates generally to electrostatic discharge (ESD) protection circuits, and more particularly to ESD protection circuits and structures that support input/output (I/O) standards such as the low voltage differential signaling (LVDS) standard and the on-chip termination (OCT) standard.

BACKGROUND

The LVDS and OCT standards are widely accepted among I/O standards that support high data rates in electronic and opto-electronic systems. LVDS has been used in applications that require low voltage, high speed, low noise, low power, and lower electromagnetic interference. In addition, LVDS supports the high data throughput necessary for high-speed interfaces such as those in backplane circuits. LVDS compliant I/O interfaces have several advantages compared to other known interface levels, including differential signals with good noise margin and compatibility over different supply voltage levels, etc. But LVDS interfaces need precise line termination resistors.

OCT compliant I/O interfaces include series, parallel, and/or differential terminations on chip, where OCT resisters are placed adjacent to I/O buffers to eliminate stub effect and to help prevent reflections. OCT provides the benefit of high signal integrity, simpler board design, lower cost systems and good system reliability. OCT also allows system designers to use fewer resistors, fewer board traces, smaller board space, and fewer excess components on printed circuit boards.

A common LVDS compliant I/O interface includes an I/O buffer and stacked transistors coupled in parallel with the I/O buffer. Since the same type of devices are typically used to form the stacked transistors and the I/O buffer, the LVDS stacked transistors are stressed at the same time as the I/O buffer during an ESD event.

OCT compliant I/O interfaces also have ESD issues because OCT transistors are often connected to the I/O pads. These OCT transistors are typically far narrower than the ones used in the I/O buffers. As such, the OCT transistors have even lower ESD threshold voltages than the transistors in the I/O buffers.

Therefore, there is a need for improved ESD protection for the LVDS and OCT compliant interface circuits.

SUMMARY

The present invention provides electrostatic discharge protection for I/O circuits that support the low voltage differential signaling (LVDS) and on-chip termination (OCT) standards. At least one additional transistor is connected across an I/O transistor. In the case of LVDS, a pair of stacked transistors is used in which the distance between the source/drain region and a well tap is substantially greater for the transistor connected to the I/O pad. A PMOS transistor and an NMOS transistor may also be connected in series between a first node such as a power supply node and the I/O pad. An OCT circuit is also disclosed in which the spacing between the source/drain region and a well tap in the OCT transistor is smaller than that in the I/O transistor.

DETAILED DESCRIPTION

Figure 1A:
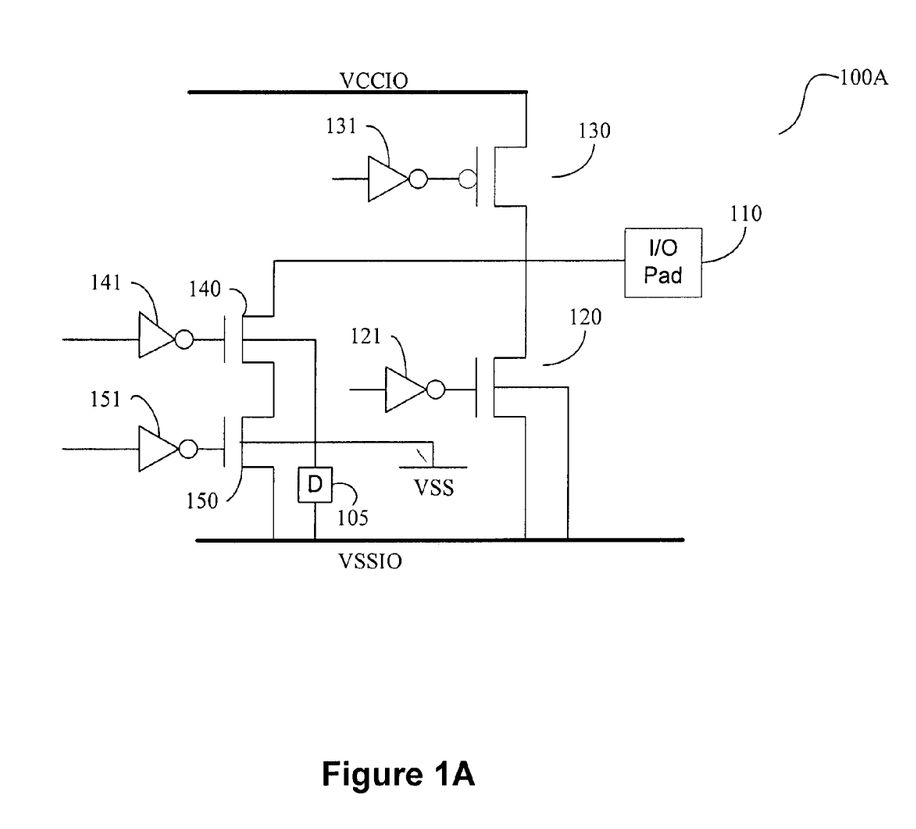
FIG. 1A is a circuit schematic of a LVDS I/O circuit according to one embodiment of the present invention.

FIG. 1 illustrates an LVDS-compliant interface circuit 100A, according to one embodiment of the present invention. The LVDS interface circuit 100 can be part of an I/O interface of an integrated circuit chip. As shown in FIG. 1, the LVDS interface circuit 100A includes an I/O pad 110 and an I/O buffer having a pull-down transistor 120 and a pull-up transistor 130 serially connected with each other between an I/O power line VCCIO and an I/O ground line VSSIO. The LVDS interface circuit 100 further includes stacked transistors 140 and 150 connected in parallel with the pull-down transistor 120 of the I/O buffer. The gates of transistors 120, 130, 140, and 150 are connected to other parts of the integrated circuit via inverters 121, 131, 141, and 151, respectively. The substrates of the stacked transistors 140 and 150 are tied to VSS, which is the ground line for a core circuit in the integrated circuit. A decoupling device 105 is used to separate the core ground VSS from the I/O ground VSSIO.

To allow the I/O buffer to function as an ESD protection device, a parasitic bipolar transistor associated with the stacked transistors should not turn on in the event of an ESD pulse on the I/O pad 110. The turn on of the parasitic bipolar transistor can be prevented by placing the stacked transistors 140 and 150, which are usually NMOS (N-type metal-oxide-semiconductor) transistors in different P-wells separated by a trench isolation. This way, a very high voltage (about 15V) is required between the I/O pad 110 and the I/O ground VSSIO to simultaneously turn on the parasitic bipolar transistors associated with the stacked transistors 140 and 150.

Although the parasitic bipolar transistors are unlikely to turn on, the drain-substrate diode of 140 can breakdown when there is a positive ESD potential between the I/O pad 110 and the I/O ground VSS. The breakdown current associated with the drain-substrate diode should be limited to protect the drain-substrate diode from ESD damage. This can be achieved by using the layout of 140 and 150 shown in FIG. 2.

Figure 2:
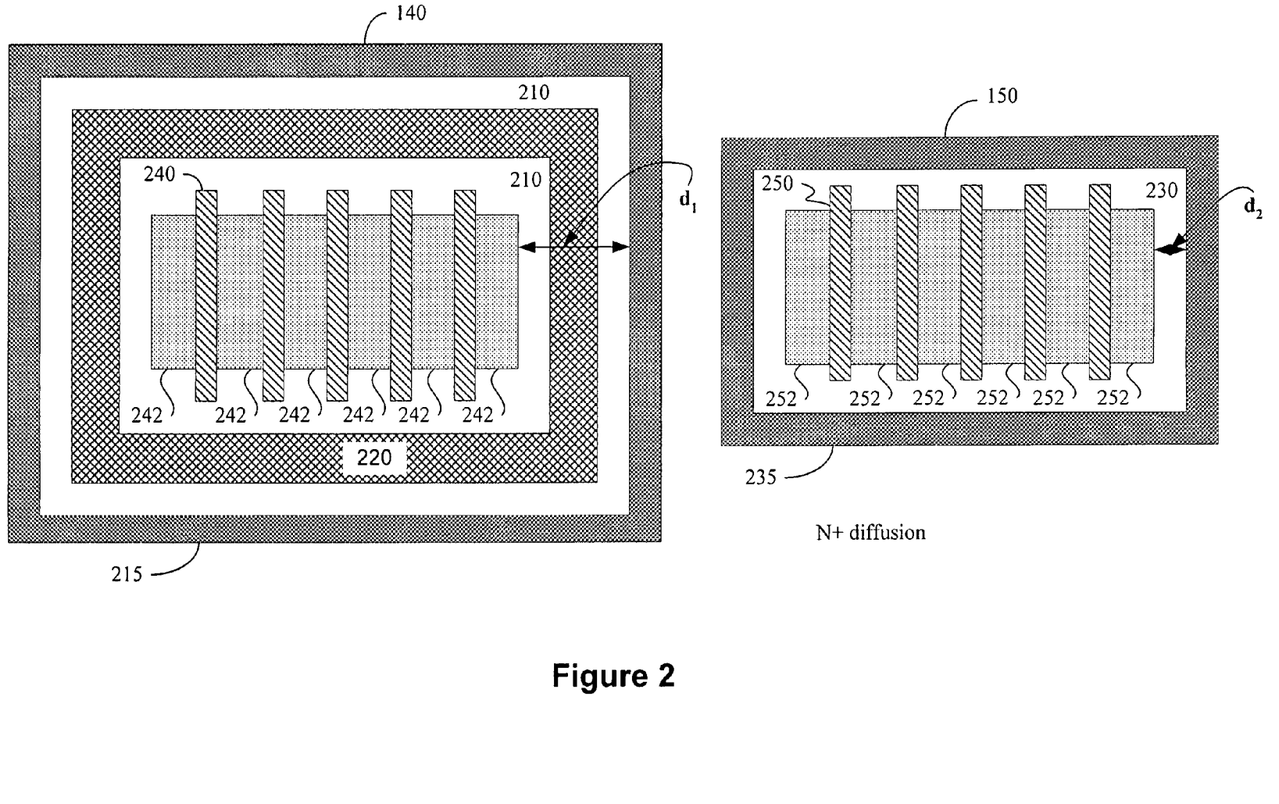
FIG. 2 is a layout drawing of two LVDS transistors in the LVDS I/O circuit.

FIG. 2 illustrates how the stacked transistors are laid out on a semiconductor substrate according to one embodiment of the present invention. As shown in FIG. 2, transistor 140 and 150 are formed in different P-wells 210 and 230, respectively. P-wells 210 and 230 are separated by an isolation region such as a trench isolation (not shown). Transistor 140 includes at least one gate 240 and at least one pair of N-type source/drain diffusion regions 242 on two opposite sides of gate 240. Transistor 150 includes at least one gate 250 and at least one pair of N-type source/drain diffusion regions 252 on opposite sides of gate 250. To prevent the parasitic bipolar transistors associated with the stacked transistors 140 and 150 from turning on in the event of an ESD pulse on the I/O pad 110, the N-type source/drain diffusion regions 242 of transistor 140 are separated from the N-type source/drain diffusion regions 252 of transistor 150 by their location in two different P-wells separated by the trench isolation.

Transistor 140 further includes a P-well tap region 215, and transistor 150 also includes a P-well tap region 235. To prevent the drain-substrate junction(s) from being damaged by an ESD pulse on the I/O pad 110, the P-well tap region 215 for transistor 140 is placed far from the source/drain diffusion region(s) 242. In particular, this placement should be such that the minimum distance between tap region 215 and source/drain diffusion regions 242 is about twice the minimum separation required by the design rules associated with the technology used to fabricate the integrated circuit. This raises the substrate resistance between the N+ diffusion regions 242 and the P-well tap 215 and thus limits any breakdown current from the drain-substrate junction(s) in transistor 140. To further increase the substrate resistance and reduce the breakdown current, transistor 140 may also include a P-well block region 220 between the N-type source/drain diffusion regions 242 and the P-well tap region 215. The presence of the P-well block region makes it possible to reduce the spacing between the N-type source/drain diffusion regions 242 and the P-well tap region 215 and thus makes the layout of 140 more compact.

In one embodiment of the present invention, the N-type source drain diffusion regions 242 and 252 are doped with N+ or N++ dopant concentrations, the P-well tap regions 215 and 235 are doped with P+ or P++ dopant concentrations, and the P-well block region 220 is undoped silicon substrate that has high resistivity.

Transistor 150 may be laid out the same as transistor 140, but such a layout for transistor 150 is usually not necessary because transistor 150 is not connected directly to the I/O pad 110 and because the decoupling device 105 provides a low-voltage clamp between VSS and VSSIO. In particular, a P-well block region is not necessary. In practice, transistor 150 can be made small by requiring the distance $d_2$ between the N+ diffusions 252 and the P-well tap 235 to be equal to or not much larger than the minimum separation required by the design rules associated with the technology used to fabricate the integrated circuits. Thus, the distance $d_1$ between the N+ diffusions 242 and the P-well tap 215 in transistor 140 will be significantly greater than $d_2$.

Figure 1B:
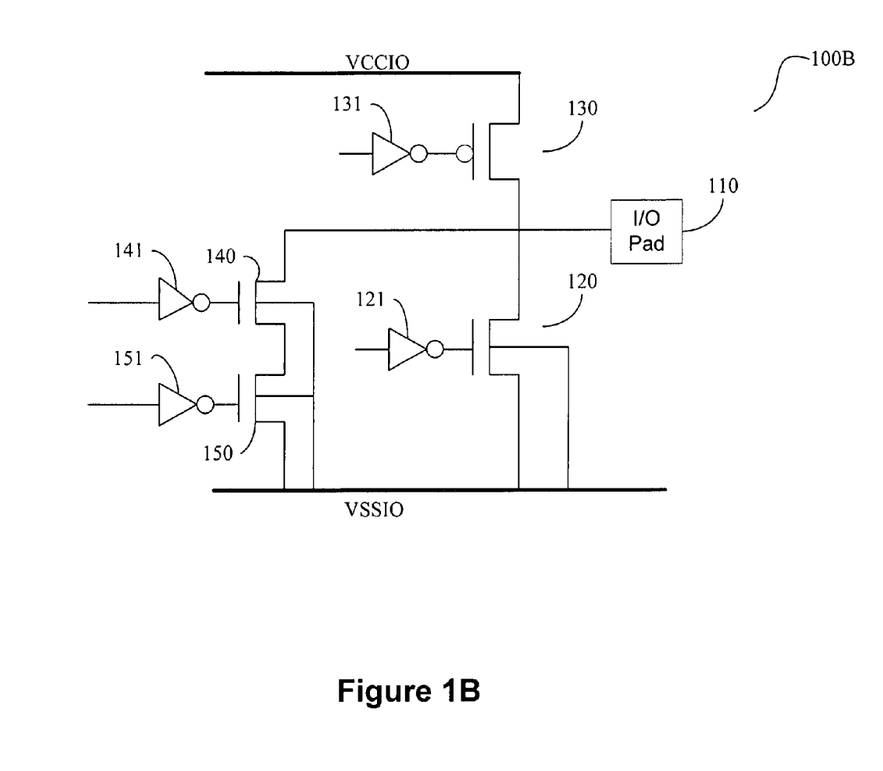
FIG. 1B is a circuit schematic of a LVDS I/O circuit according to an alternative embodiment of the present invention.

To minimize any stress voltage at the drain-substrate junction(s) in transistor 140, it is preferred that decoupling device 105 of FIG. 1A be eliminated and the substrate near transistor 140 be tied to the I/O ground line VSSIO, as in an I/O interface circuit 100B shown in FIG. 1B. In other respects, the components of I/O interface circuit 100B are the same as those of I/O interface circuit 100A and have been numbered the same. In the absence of decoupling device 105, the parasitic bipolar transistor in the I/O pull-down transistor 120 can be turned on at a lower voltage when a positive ESD voltage is across the I/O pad and the core ground VSS because the additional voltage drop across the decoupling device 105 is not present.

Furthermore, transistor 140 should be placed as far away from the I/O pad 110 as other design considerations allow so that the interconnect resistance and inductance between the I/O pad 110 and transistor 140 can be used to help limit the ESD current.

Figure 3:
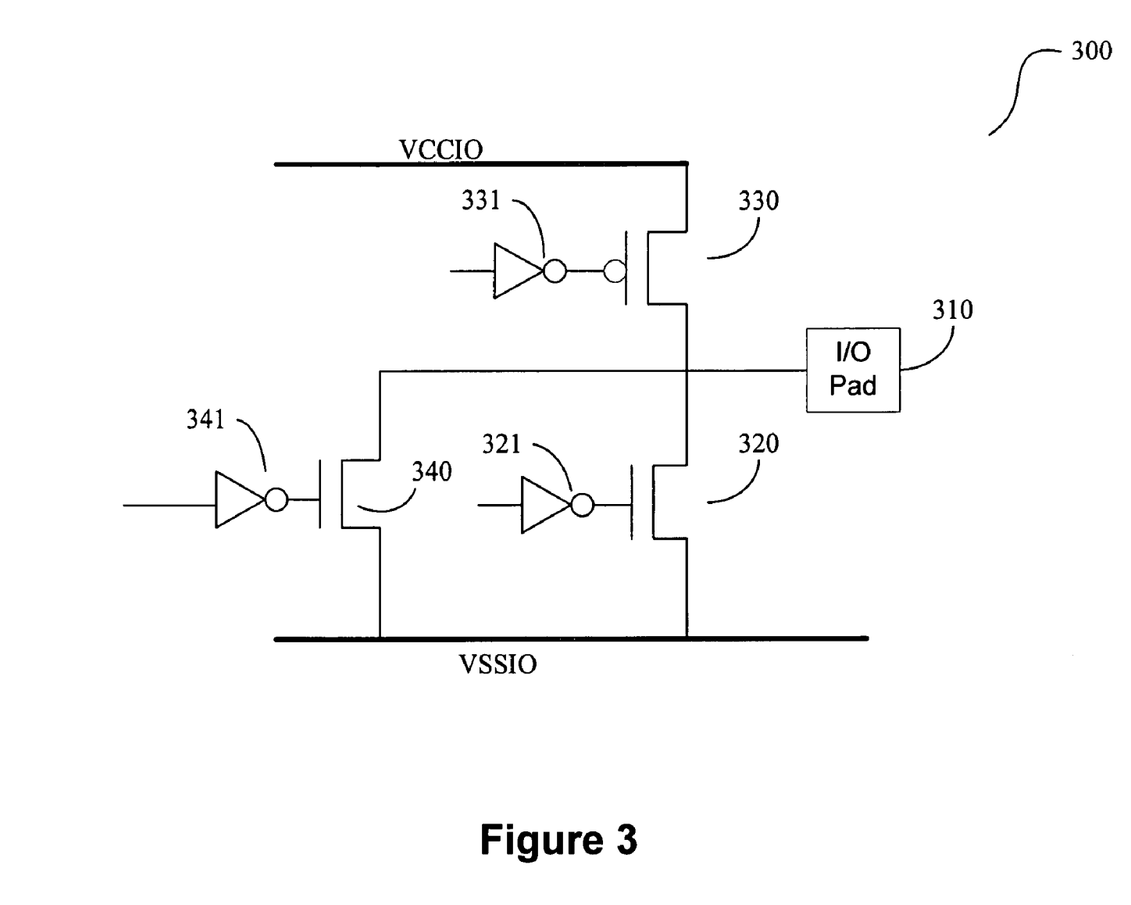
FIG. 3 is a circuit schematic of an OCT I/O circuit according to one embodiment of the present invention.

FIG. 3 illustrates a series OCT interface circuit 300 according to another embodiment of the present invention. The series OCT interface circuit 300 can be part of an I/O interface of an integrated circuit chip. As shown in FIG. 3, the series OCT interface circuit 300 includes an I/O pad 310 and an I/O buffer having a pull-down transistor 320 and a pull-up transistor 330 serially connected with each other between an I/O power line VCCIO and an I/O ground line VSSIO. The series OCT interface circuit 300 further includes a narrow OCT transistor 340 connected in parallel with the pull-down transistor 320 of the I/O buffer. The gates of transistors 320, 330, and 340 are connected to other parts of the integrated circuit via inverters 321, 331, and 341, respectively. To protect the series OCT transistor 340 during an ESD event, the parasitic bipolar transistors associated with the I/O buffer should have a lower triggering voltage than the series OCT transistor 340. This can be achieved by laying out the I/O pull-down transistor 320 and the series OCT transistor 340 according to the layout drawing in FIG. 4.

Figure 4:
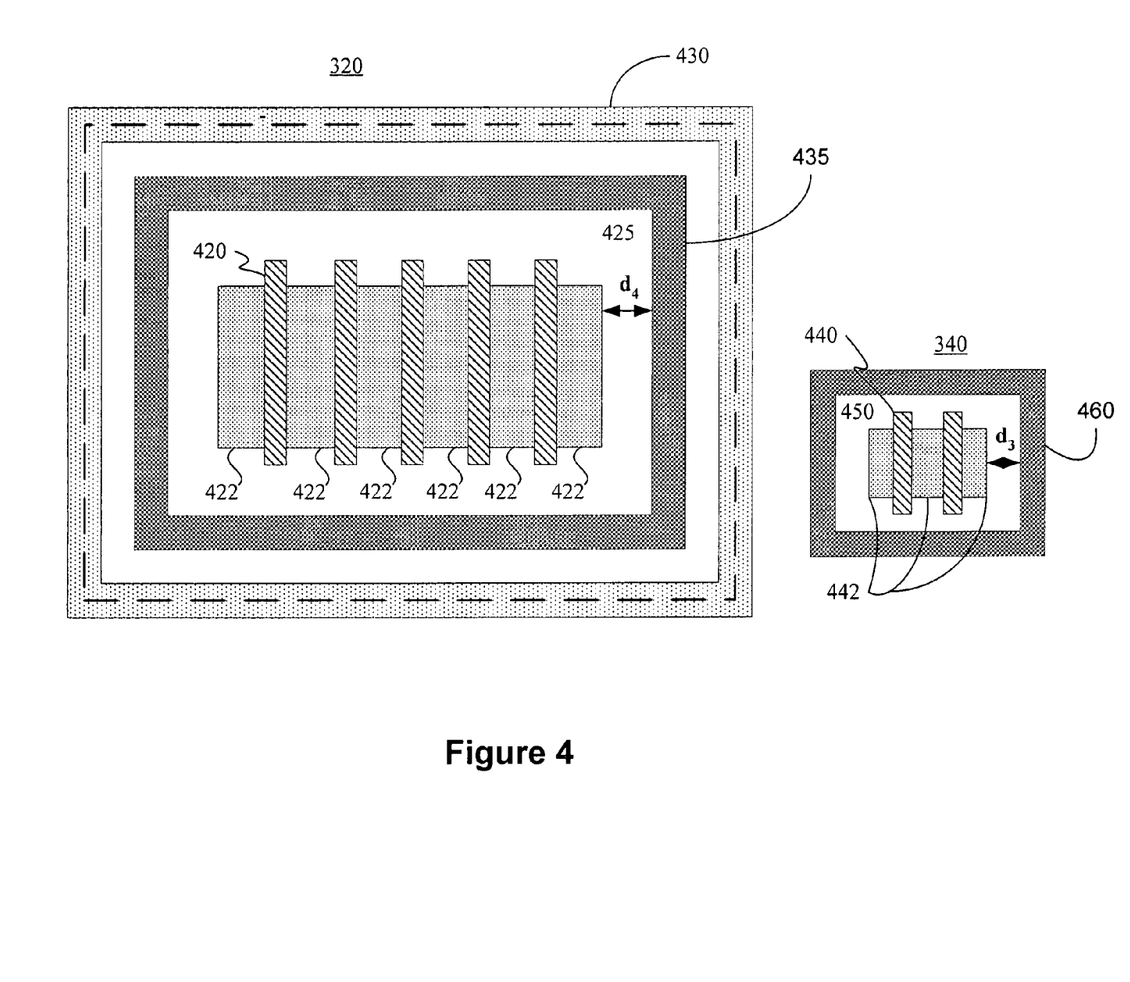
FIG. 4 is a layout drawing of I/O pull-down and OCT transistors in the OCT I/O circuit.

As shown in FIG. 4, the series OCT transistor 340 includes at least one gate 440 and at least one pair of N-type source/drain diffusion regions 442 that are formed in a P-well or P-substrate 450. The series OCT transistor 340 may further include a P-well tap region 460 surrounding the N-type source/drain diffusion region 442. In one embodiment of the present invention, the N-type source drain diffusion regions 442 are doped with N+ or N++ dopant concentrations, while the P-well tap region 460 is doped with a P+ or P++ dopant concentration. The spacing between the P-well tap region 460 and the source/drain diffusion regions 442 for the series OCT transistor 340 is small, and in many cases should be as small as the minimum spacing between N+ (or N++) and P+ (or P++) regions allowable by design rules associated with the fabrication technology for making the integrated circuit chip.

The I/O pull-down transistor 320 includes at least one gate 420 and at least one pair of N-type source/drain diffusion regions 422 that are formed in an isolated P-well 425, which is surrounded by a deep N-well 430. The I/O pull-down transistor 320 further includes a P-well tap region 435 between the N-type source/drain diffusion regions 422 and the deep N-well 430. In one embodiment of the present invention, the N-type source drain diffusion regions 422 in the I/O pull-down transistor 320 are doped with N+ or N++ dopant concentrations, the P-well tap region 435 is doped with a P+ or P++ dopant concentration, and the deep N-well region 430 is doped with a N-well dopant concentration, which is much lower than the dopant concentrations in the N-type source/drain regions 422. The P-well tap region 435 is laid out such that it is spaced far from the N-type source/drain regions 422 and, in particular, is at least twice the minimum spacing required by the design rules associated with the technology used to fabricate the integrated circuit. In many cases, the spacing between the P-well tap region 435 and the N-type source/drain regions 422 should be as wide as space in the integrated circuit chip allows. Thus, the spacing $d_4$ between the P-well tap region 435 and the N-type source/drain regions 422 for the I/O pull-down transistor 320 should be significantly wider than the spacing $d_3$ between the P-well tap region 460 and the N-type source/drain regions 442 in the series OCT transistor 340.

The wider spacing between the P-well tap region 435 and the N-type source/drain regions 422 enables the I/O pull-down transistor 320 to be triggered by a lower substrate current generated by the breakdown of the junction between the drain diffusion 422 and the isolated P-well 425. By isolating the P-well 425 for the I/O pull-down transistor 320 using the deep N-well 430, the P-well 425 can also charge up faster to forward-bias the source/P-well junction, which forward-biasing is required for triggering the parasitic bipolar transistor in the event of a ESD pulse on the I/O pad 310. This, when combined with the lower triggering current, provides a lower trigger voltage for the I/O pull-down transistor 320. If possible, the series OCT transistor 340 should be placed far away from the I/O pad so that the higher resistance and inductance associated with the interconnect between the series OCT transistor 340 and the I/O pad 310 can be used to limit the ESD current through the series OCT transistor 340.

Figure 5:
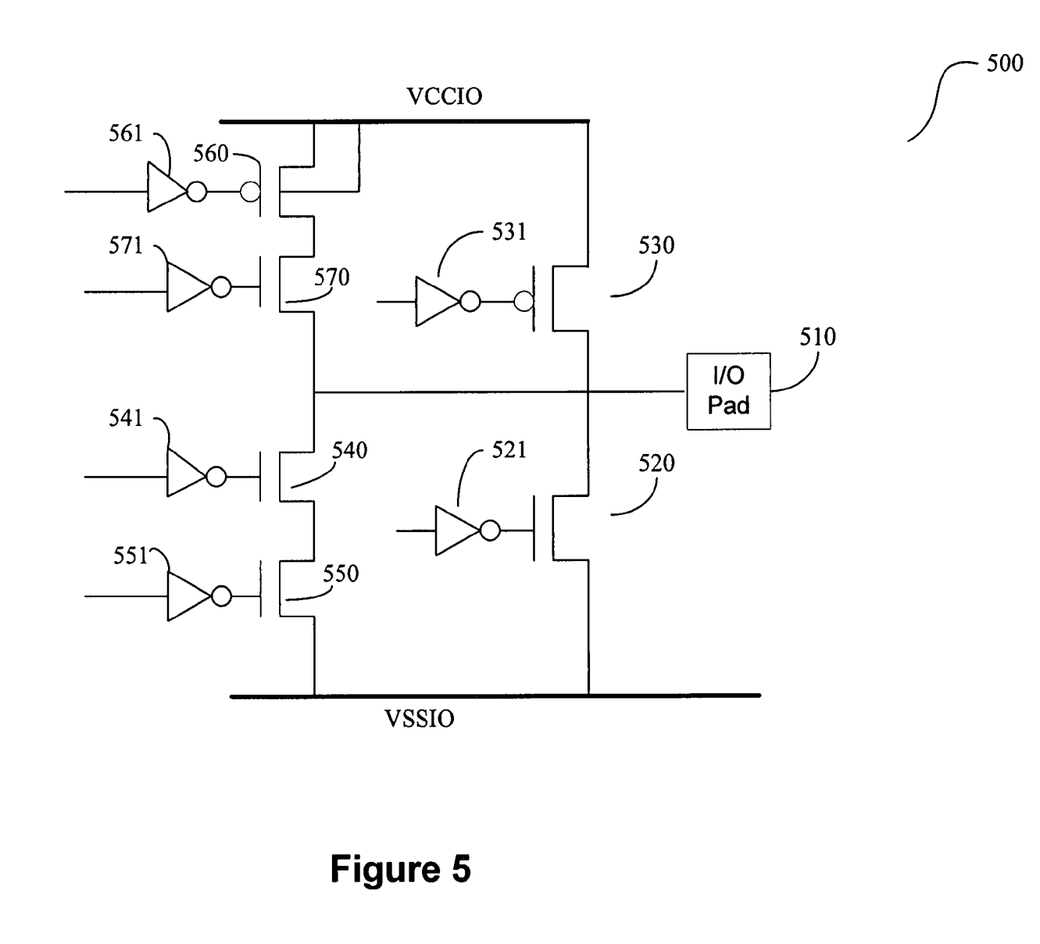
FIG. 5 is a circuit schematic of a parallel OCT I/O circuit according to one embodiment of the present invention.

FIG. 5 illustrates a parallel OCT interface circuit 500 according to another embodiment of the present invention. The parallel OCT interface circuit 500 can be part of an I/O interface of an integrated circuit chip. As shown in FIG. 5, the parallel OCT interface circuit includes an I/O pad 510 and an I/O buffer having a pull-down transistor 520 and a pull-up transistor 530 serially connected with each other between an I/O power line VCCIO and an I/O ground line VSSIO. The parallel OCT interface circuit 500 further includes two cascaded NMOS transistors 540 and 550 connected between the I/O pad 510 and the I/O ground VSSIO, and one pair of PMOS and NMOS transistors 560 and 570, respectively, that are connected serially with each other between the I/O power line VCCIO and the I/O pad 510. The gates of transistors 520, 530, 540, 550, 560, and 570 are connected to other parts of the integrated circuit via inverters 521, 531, 541, 551, 561 and 571, respectively.

Figure 6:
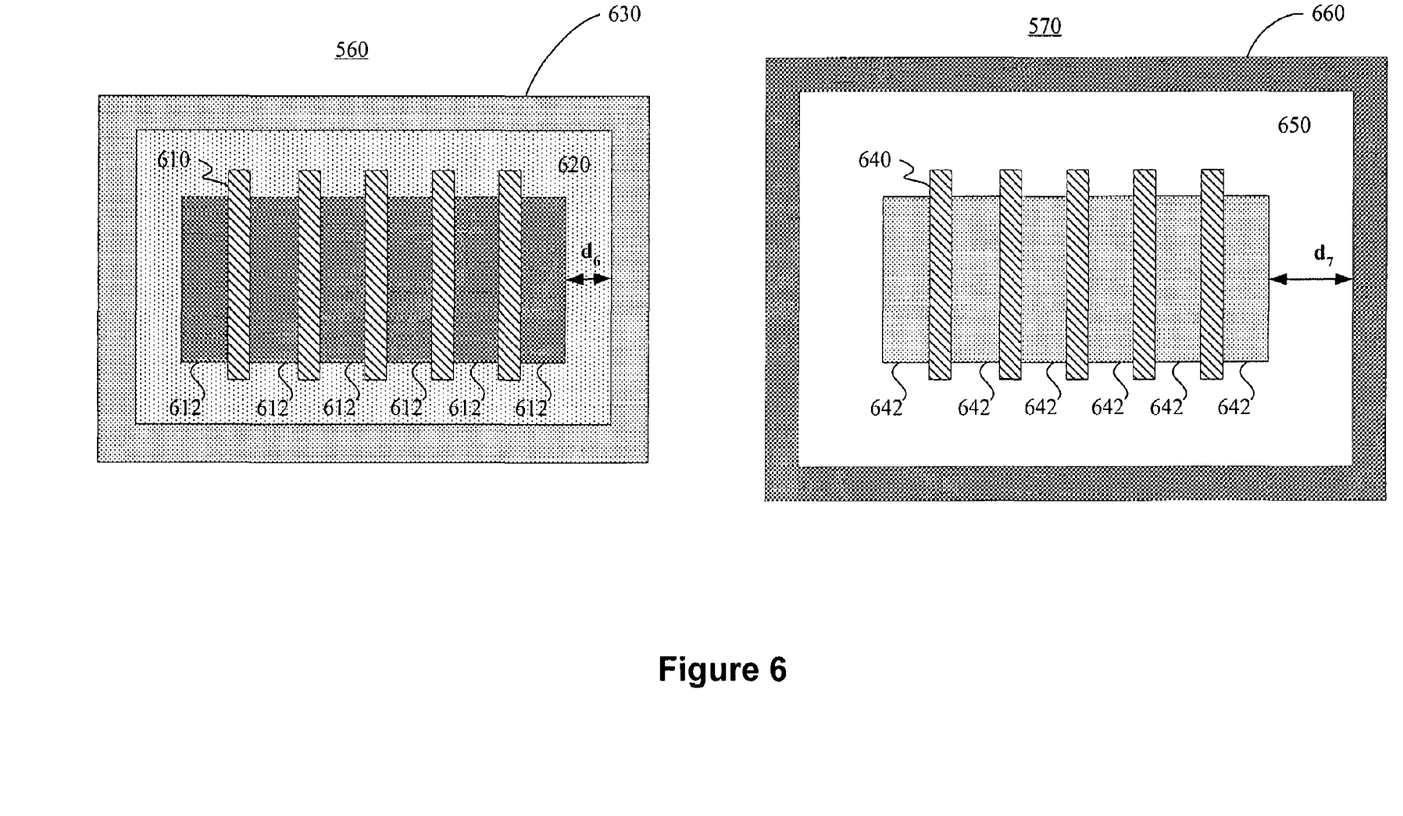
FIG. 6 is a layout drawing of parallel OCT transistors in the parallel OCT I/O circuit.

ESD protection for the two cascaded NMOS transistors 540 and 550 and the pair of PMOS and NMOS transistors 560 and 570 can be achieved by laying out transistors 540 and 550 similar to LVDS transistors 140 and 150, respectively, as shown in FIG. 2, and by laying out transistors 560 and 570 according to the layout drawing shown in FIG. 6.

As shown in FIG. 6, the PMOS transistor 560 includes at least one gate 610 and at least one pair of P-type source/drain diffusion regions 612 that are formed in a N-well 620. PMOS transistor 560 further includes a N-well tap region 630 that is spaced from the P-type source/drain diffusion regions 611 by a distance $d_6$. On the other hand, the NMOS transistor 570 includes at least one gate 640 and at least one pair of N-type source/drain diffusion regions 642 that are formed in a P-well 650. The NMOS transistor 570 may further include a P-well tap region 660 that is spaced from the N-type source/drain diffusion regions 642 by a distance $d_7$.

In one embodiment of the present invention, the P-type source/drain diffusion regions 612 and the N-type source drain diffusion regions 642 are doped with P+ (or P++) and N+ (or N++) dopant concentrations, respectively; the N-well 620 and P-well 650 are doped with a N-well dopant concentration and a P-well dopant concentration lower than the dopant concentrations of the source/drain diffusion regions in these wells; and the N-well tap region 630 and the P-well tap region 660 are doped with a N+ (or N++) and P+ (or P++) dopant concentrations, respectively.

In one embodiment of the present invention, the distance $d_7$ between the P-well tap region 660 and the N-type source/drain diffusion regions 642 is made large to protect the drain-substrate diode associated with the transistor, which is connected directly to the I/O pad 510. In particular, $d_6$ should be at least about twice the minimum spacing allowed by the design rules associated with the technology for fabricating the integrated circuit. On the other hand, since the substrate of transistor 560 is connected to VCCIO, the associated drain-substrate diode has no potential drop during an ESD event. Thus, the layout for transistor 560 can be made compact, requiring only that the distance $d_6$ between the P+ diffusion regions 612 and the N-well tap 630 to be equal to or not much larger than the minimum spacing between a P+ diffusion region and a N-well tap allowed by the design rules associated with the technology for fabricating the integrated circuit. Alternatively, if the substrate of transistor 560 is not tied to VCCIO, the spacing $d_6$ must be made larger to protect the drain-substrate diode in transistor 560.

Figure 7:
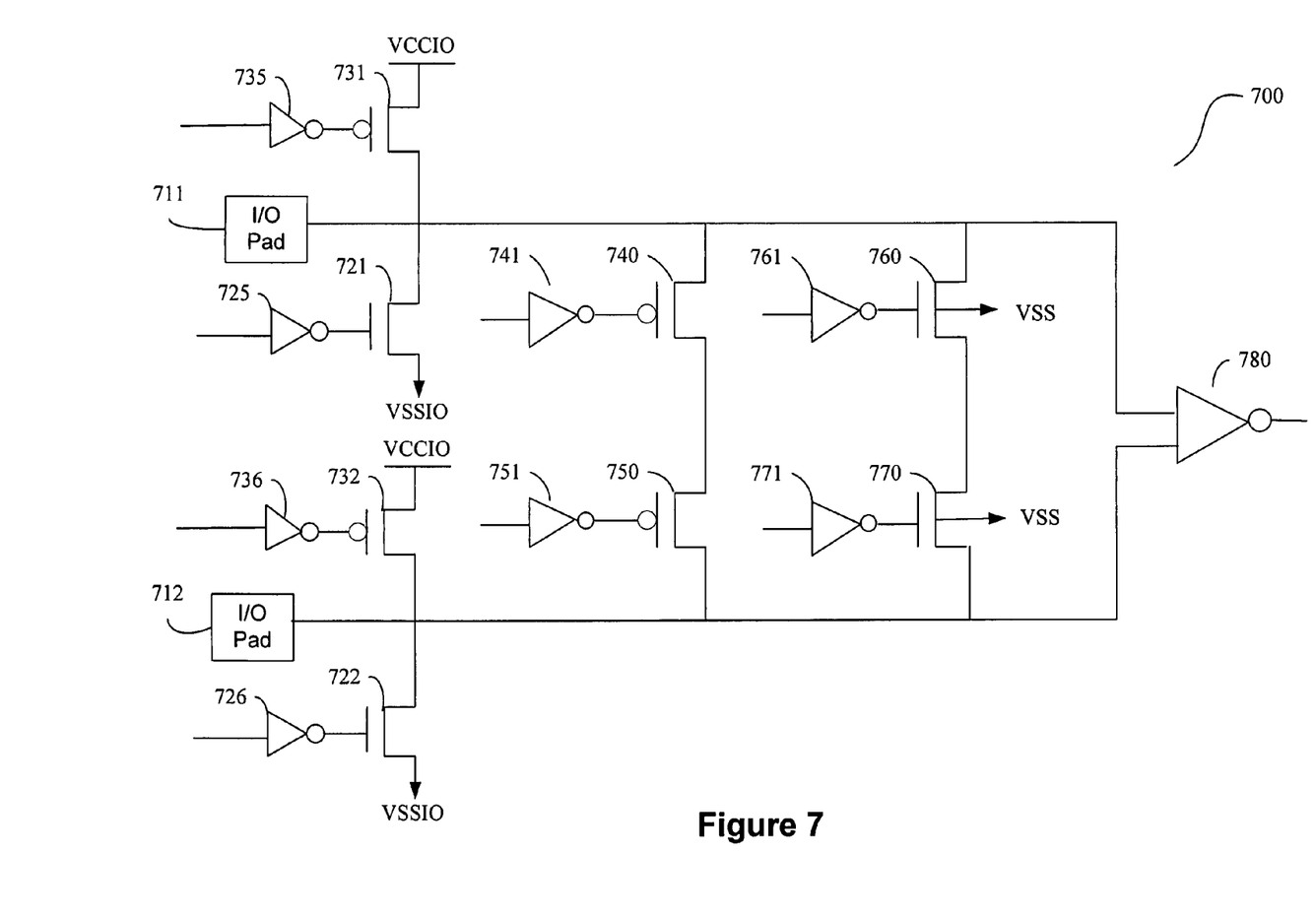
FIG. 7 is a circuit schematic of a differential OCT I/O circuit according to one embodiment of the present invention.

FIG. 7 illustrates a differential OCT interface circuit 700 according to one embodiment of the present invention. The differential OCT interface circuit 700 can be part of an I/O interface of an integrated circuit chip. As shown in FIG. 7, the differential OCT interface circuit 700 includes two I/O pads 711 and 712 and two I/O buffers coupled to the respective ones of the I/O pads. The I/O buffer coupled to the I/O pad 711 includes a pull-down transistor 721 and a pull-up transistor 731 that are serially connected with each other between an I/O power line VCCIO and an I/O ground line VSSIO. Likewise, the I/O buffer coupled to the I/O pad 712 includes a pull-down transistor 722 and a pull-up transistor 732 that are serially connected with each other between the I/O power line VCCIO and the I/O ground line VSSIO. The gates of transistors 721, 731, 722 and 732 are connected to other parts of the integrated circuit through inverters 725, 735, 726 and 736, respectively.

The differential OCT interface circuit 700 further includes a pair of stacked PMOS transistors 740 and 750 connected between the I/O pads 711 and 712, and a pair of stacked NMOS transistors 760 and 770 connected between the two I/O pads 711 and 712. The gates of transistors 740, 750, 760 and 770 are connected to other parts of the integrated circuit through inverters 741, 751, 761 and 771, respectively. When the I/O pads 711 and 712 are used as input pads, signals from the I/O pads 711 and 712 are fed to a differential amplifier 780. In one embodiment of the present invention, the substrates of transistors 740 and 750 are connected to input pads 711 and 712, respectively, or to VCCIO if VCCIO has a higher voltage than the input voltages on the input pads. The substrates of transistors 760 and 770 are tied to the core ground VSS. ESD protection for the differential OCT interface circuit 700 can be achieved with a layout similar to transistor 560 in FIG. 6 for the PMOS transistors 740 and 750 but with a larger $d_6$ and a layout similar to transistor 570 in FIG. 6 for the NMOS transistors 760 and 770.

Figure 8A:
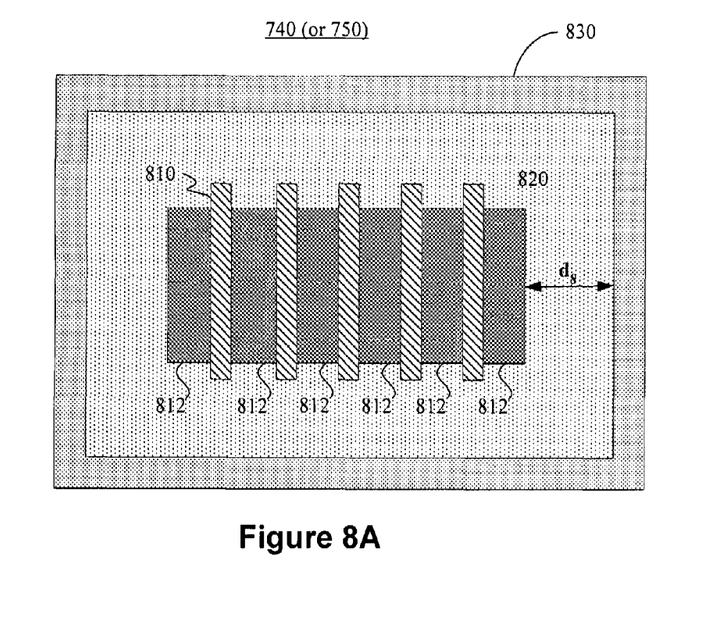
FIGS. 8A and 8B are layout drawings of stacked PMOS and NMOS transistors, respectively, in the OCT I/O circuit.
Figure 8B:
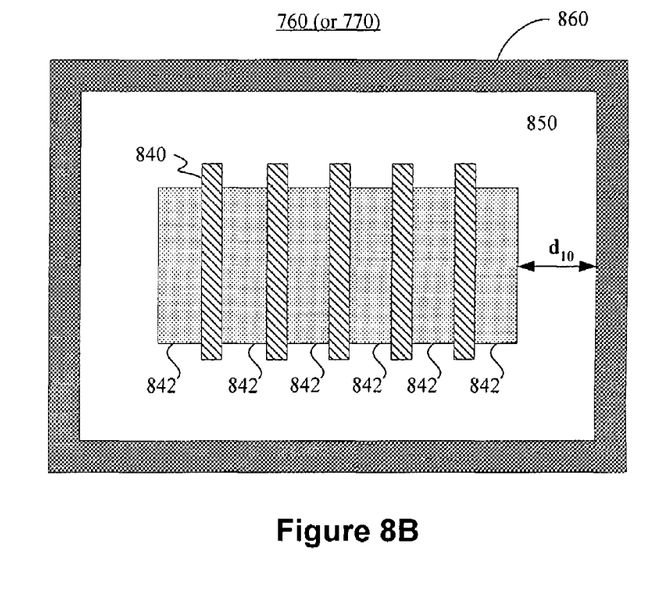

In particular, as shown in FIG. 8A, PMOS transistor 740 or 750 includes at least one gate 810 and at least one pair of P-type source/drain diffusion regions 812 that are formed in N-well 820. PMOS transistor 740 or 750 further includes an N-well tap region 830 that is spaced from the P-type source/drain diffusion regions by a distance $d_8$, which is substantially larger than the minimum distance between a P-type source/drain diffusion region and a N-well tap region allowed by the design rules for the technology used to fabricate the integrated circuit. As shown in FIG. 8B, the NMOS transistor 760 or 770 includes at least one gate 840 and at least one pair of N-type source/drain diffusion regions 842 that are formed in P-well 850. NMOS transistor 760 or 770 further includes a P-well tap region 860 that is spaced from the N-type source/drain diffusion regions by a distance $d_{10}$, which is substantially larger than the minimum distance between a N-type source/drain diffusion region and a P-well tap region allowed by in the design rules for the technology used to fabricate the integrated circuit. By substantially larger is meant at least twice the minimum spacing allowed between the diffusion regions and the tap region by the design rules associated with the technology for fabricating the integrated circuit.

As will be apparent to those skilled in the art, numerous embodiments of the invention may be devised within the spirit and scope of the claims.

We claim:

1. An I/O interface circuit, comprising:
an I/O pad;
an I/O transistor connected to the I/O pad; and
stacked transistors connected to the I/O pad in parallel with I/O transistor, each one of said stacked transistors having source/drain diffusion regions placed in a well and a well tap spaced apart from the source/drain diffusion regions, at least two of the stacked transistors being in separate wells where a distance between the well tap and the source/drain diffusion regions in one of the wells is significantly larger than a corresponding distance in the other one of the wells.

2. An I/O interface circuit, comprising: an I/O pad; an I/O transistor connected to the I/O pad; and stacked transistors connected to the I/O pad in parallel with I/O transistor, each one of said stacked transistors having source/drain diffusion regions placed in a well and a well tap spaced apart from the source/drain diffusion regions, a distance between the well tap and the source/drain diffusion regions in one of the stacked transistors being significantly larger than a corresponding distance in the other one of the stacked transistors wherein the stacked transistors are NMOS transistors, each formed in a different P-well.

3. An I/O interface circuit, comprising: an I/O pad; an I/O transistor connected to the I/O pad; and stacked transistors connected to the I/O pad in parallel with I/O transistor, each one of said stacked transistors having source/drain diffusion regions placed in a well and a well tap spaced apart from the source/drain diffusion regions, a distance between the well tap and the source/drain diffusion regions in one of the stacked transistors being significantly larger than a corresponding distance in the other one of the stacked transistors wherein the stacked transistors are serially connected between the I/O pad and an I/O ground, with a substrate terminal of each of the stacked transistors tied to the I/O ground.

4. The circuit of claim 3 wherein the P-wells are separated by a trench isolation.

5. The circuit of claim 3 further comprising a P-well block region between the source/drain diffusion region and a P-well tap region in at least one of the stacked transistors.

6. The circuit of claim 5 wherein the source/drain diffusion regions are doped with N+ or N++ dopant concentration, the P-well tap region is doped with P+ or P++ dopant concentration and the P-well block region is undoped.

7. An I/O interface circuit, comprising: an I/O pad; an I/O transistor connected to the I/O pad; and stacked transistors connected to the I/O pad in parallel with I/O transistor, each one of said stacked transistors having source/drain diffusion regions placed in a well and a well tap spaced apart from the source/drain diffusion regions, a distance between the well tap and the source/drain diffusion regions in one of the stacked transistors being significantly larger than a corresponding distance in the other one of the stacked transistors further comprising a PMOS transistor and an NMOS transistor connected in series between a first node and the I/O pad.

8. The circuit of claim 7 wherein the PMOS transistor comprises at least one gate and at least one pair of source and drain diffusion regions on opposite sides of the gate and an N-well tap surrounding said source and drain diffusion regions and separated therefrom by a first distance.

9. The circuit of claim 8 wherein the NMOS transistor comprises at least one gate and at least one pair of source and drain diffusion regions on opposite sides of the gate and a P-well tap surrounding said source and drain diffusion regions and separated therefrom by a second distance.

10. The circuit of claim 9 wherein the second distance is greater than the first distance.

11. An I/O interface circuit, comprising:
an I/O pad;
an I/O transistor connected to the I/O pad, the I/O transistor having source/drain diffusion regions placed in a well and a well tap spaced part from the source/drain diffusion regions by a first distance; and
an OCT transistor connected to the I/O pad in parallel with the I/O transistor, the OCT transistor having source/drain diffusion regions placed in a well and a well tap spaced apart from the source/drain diffusion regions by a second distance, the second distance being substantially smaller than the first distance.

12. The circuit of claim 11 wherein the I/O transistor is an NMOS transistor.

13. The circuit of claim 11 wherein the I/O transistor is formed in a P-well and the P-well is surrounded by a deep N-well.

14. The circuit of claim 13 wherein the OCT transistor is formed in a P-well.

15. The circuit of claim 11 wherein the source/drain diffusion regions are doped with N+ or N++ dopant concentration and the well taps are doped with P+ or P++ dopant concentration.

16. An integrated circuit having a differential I/O interface circuit, comprising:
first and second I/O pads;
at least one I/O transistor connected to the first I/O pad;
at least one I/O transistor connected to the second I/O pad;
first and second PMOS transistors connected in series between the first and second I/O pads;
first and second NMOS transistors connected in series between the first and second I/O pads;
a differential amplifier having first and second inputs connected to said first and second I/O pads; and
each one of said first and second PMOS and NMOS transistors having source/drain diffusion regions placed in a well and a well tap spaced apart from the source/drain diffusion regions by a distance substantially greater than a corresponding minimum distance allowed by design rules of a technology used to fabricate the integrated circuit.

17. The circuit of claim 16 wherein the first and second PMOS transistors are formed in separate N-wells.

18. The circuit of claim 17 wherein the first and second NMOS transistors are formed in separate P-wells.

19. The circuit of claim 16 wherein a substrate terminal of each of the NMOS transistors is tied to an I/O ground.

20. The circuit of claim 16 wherein a substrate terminal of each of the PMOS transistors is tied to an I/O ground, or to a different one of the first and second I/O pads if an input voltage of the I/O pad is higher than the I/O ground.

* * * * *